US009184075B2

(12) United States Patent
Kim et al.

(10) Patent No.: US 9,184,075 B2
(45) Date of Patent: Nov. 10, 2015

(54) APPARATUS FOR STORING SUBSTRATES

(71) Applicant: Samsung Display Co., Ltd., Yongin, Gyeonggi-Do (KR)

(72) Inventors: Ji-Eun Kim, Yongin (KR); Dong-Yoon So, Yongin (KR); Han-Soo Kim, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/185,041

(22) Filed: Feb. 20, 2014

(65) Prior Publication Data
US 2014/0231306 A1 Aug. 21, 2014

(30) Foreign Application Priority Data

Feb. 20, 2013 (KR) .................. 10-2013-0018172

(51) Int. Cl.
*B65D 85/48* (2006.01)
*H01L 21/673* (2006.01)

(52) U.S. Cl.
CPC .......... *H01L 21/67326* (2013.01); *B65D 85/48* (2013.01); *H01L 21/67369* (2013.01)

(58) Field of Classification Search
CPC ............... H01L 21/067326; H01L 21/67369; B65D 85/48
USPC ................. 206/454, 710, 711, 448, 561, 832; 211/41.18
See application file for complete search history.

(56) References Cited

U.S. PATENT DOCUMENTS

| 3,095,971 | A | * | 7/1963 | Van Antwerpen | 206/448 |
| 7,431,158 | B2 | * | 10/2008 | Yamada et al. | 206/454 |
| 7,922,000 | B2 | * | 4/2011 | Hyobu | 206/454 |
| 8,251,220 | B2 | * | 8/2012 | Ting et al. | 206/587 |
| 2001/0019370 | A1 | * | 9/2001 | Park | 349/1 |
| 2001/0027934 | A1 | * | 10/2001 | Yoneda et al. | 206/454 |
| 2002/0070140 | A1 | * | 6/2002 | Okamoto | 206/454 |
| 2003/0141213 | A1 | * | 7/2003 | Bartholomew et al. | 206/454 |
| 2003/0164318 | A1 | * | 9/2003 | Lacasse et al. | 206/448 |
| 2005/0189253 | A1 | * | 9/2005 | Huang | 206/454 |
| 2005/0247594 | A1 | * | 11/2005 | Mimura et al. | 206/710 |
| 2005/0274645 | A1 | * | 12/2005 | Hasegawa et al. | 206/710 |
| 2006/0016709 | A1 | * | 1/2006 | Chen et al. | 206/454 |
| 2007/0006803 | A1 | * | 1/2007 | Cadwell et al. | 206/710 |
| 2012/0043254 | A1 | * | 2/2012 | Inoue | 206/711 |
| 2013/0091809 | A1 | * | 4/2013 | Shi | 206/725 |
| 2013/0233759 | A1 | * | 9/2013 | Chan et al. | 206/589 |
| 2013/0277268 | A1 | * | 10/2013 | Fulller | 206/710 |

FOREIGN PATENT DOCUMENTS

| KR | 10-2001-0077788 A | 8/2001 |
| KR | 10-2003-0026823 A | 4/2003 |
| KR | 10-2004-0032606 A | 4/2004 |
| KR | 10-2006-0074064 A | 7/2006 |
| KR | 10-2007-0044362 A | 4/2007 |
| KR | 10-2007-0104242 A | 10/2007 |

* cited by examiner

*Primary Examiner* — Luan K Bui
(74) *Attorney, Agent, or Firm* — Lee & Morse, P.C.

(57) ABSTRACT

An apparatus for storing a substrate on which a pattern is formed includes a main body storing the substrate, a first pad located at the bottom of the main body and including a first groove supporting one edge of the substrate, a second pad neighboring the first pad and including a second groove supporting the center of the substrate, and a third pad spaced from the first pad, the second pad being disposed between the first and third pads, the third pad including a third groove supporting the other edge of the substrate.

4 Claims, 4 Drawing Sheets

(A)

(B)

(C)

APPARATUS FOR STORING SUBSTRATES

CROSS-REFERENCE TO RELATED APPLICATION

This application claims priority to and the benefit of Korean Patent Application No. 10-2013-0018172, filed in the Korean Intellectual Property Office on Feb. 20, 2013, the entire contents of which are incorporated herein by reference.

BACKGROUND

1. Field

Embodiments relate to an apparatus for storing substrates.

2. Description of the Related Art

A substrate storage apparatus may store a plurality of substrates spacing the substrates from one another by holding edges of the substrates with a groove.

The above information disclosed in this background section is only for enhancement of understanding of the background of the described technology and therefore it may contain information that does not form the prior art that is already known in this country to a person of ordinary skill in the art.

SUMMARY

Embodiments are directed to an apparatus for storing a substrate on which a pattern is formed, the apparatus including a main body storing the substrate, a first pad located at the bottom of the main body and including a first groove supporting one edge of the substrate, a second pad neighboring the first pad and including a second groove supporting the center of the substrate, and a third pad spaced from the first pad, the second pad being disposed between the first and third pads, the third pad including a third groove supporting the other edge of the substrate.

Elongation directions of the first and third grooves may correspond to a virtual straight line.

An elongation direction of the second groove may not correspond to the virtual straight line.

The substrate may be bent.

The substrate may have a thickness in the range of 0.1 mm to 0.5 mm.

Each of the first, second and third grooves may be formed by neighboring slope faces.

The apparatus may further include a storage cover covering the main body and including a supporting groove for supporting one edge of the substrate.

The supporting groove may have a rectangular form.

BRIEF DESCRIPTION OF THE DRAWINGS

Features will become apparent to those of skill in the art by describing in detail example embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

For clarity of description, parts unrelated to description may be omitted, and the same reference numbers will be used throughout this specification to refer to the same or like parts.

Components having the same configuration in example embodiments will be described using the same reference numbers in a first example embodiment, and will be used throughout the example embodiments to refer to the same parts, and a first example embodiment will be described and only parts different from those of the first example embodiment will be explained in other example embodiments.

The size and thickness of each component are illustrated discretionally for better understanding and ease of description, and thus the embodiments are not limited thereto.

In addition, unless explicitly described to the contrary, the word "comprise" and variations such as "comprises" or "comprising", will be understood to imply the inclusion of stated elements but not the exclusion of any other elements.

Figure 1:
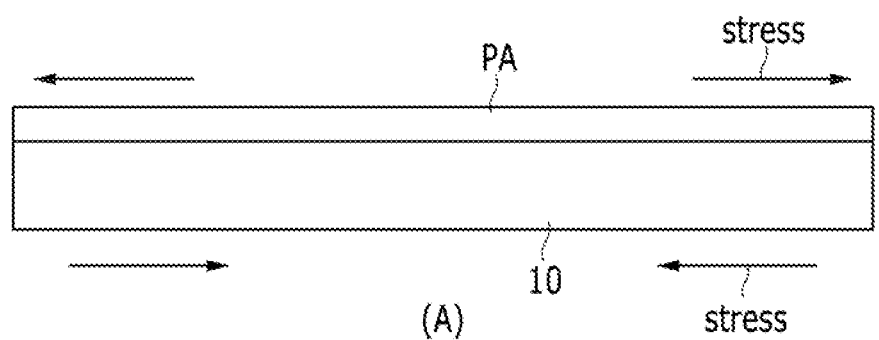
FIGS. 1(A)-(C) illustrate a substrate stored in a substrate storage apparatus according to a first example embodiment.
Figure 1:
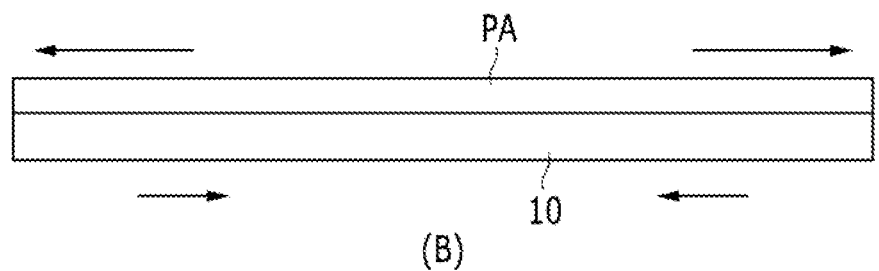
Figure 1:
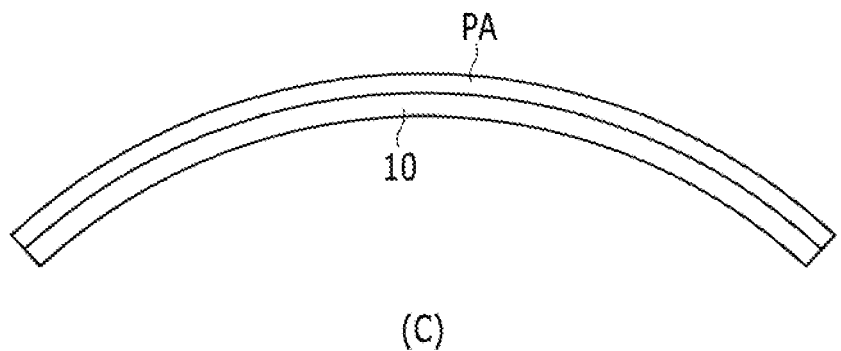

An apparatus for storing substrates according to a first example embodiment will now be described with reference to FIGS. 1, 2 and 3.

FIGS. 1(A)-(C) illustrate a substrate stored in the substrate storage apparatus according to the first example embodiment.

As shown in FIGS. 1(A)-(C), a substrate 10 stored in the substrate storage apparatus according to the first example embodiment may be bent.

In the present example embodiment, as shown in FIG. 1(A), a pattern PA of an organic light emitting diode OLED or an electrostatic touch sensor is formed on the substrate 100 such as a flat glass substrate having a thickness in the range of, e.g., 1 mm to 10 mm.

Referring to FIG. 1(B), the backside of the substrate 10 is wet-etched in order to obtain a slim substrate. In this case, the thickness of the substrate decreases, and thus the balance of stress between the pattern PA and the substrate 10 is lost. Consequently, the substrate 10 having a thickness in the range of 0.1 mm to 0.5 mm is bent, as shown in FIG. 1(C).

Figure 2:
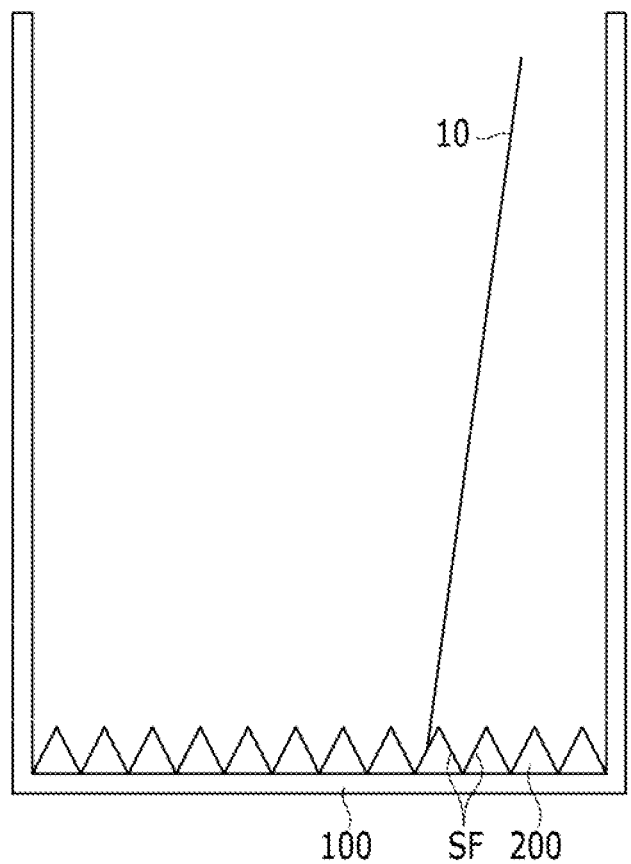
FIG. 2 illustrates the substrate storage apparatus according to the first example embodiment.

FIG. 2 illustrates the substrate storage apparatus according to the first example embodiment.

Referring to FIG. 2, the substrate storage apparatus 1000 according to the first example embodiment stores the above-mentioned substrate 10 having a thickness in the range, e.g., of 0.1 mm to 0.5 mm, and includes a main body 100 and a pad unit 200.

In the present example embodiment, the main body 100 has a box shape and stores a plurality of bent substrates 10. The pad unit 200 is located at the bottom of the main body 100 and supports the plurality of bent substrates 10.

Figure 3:
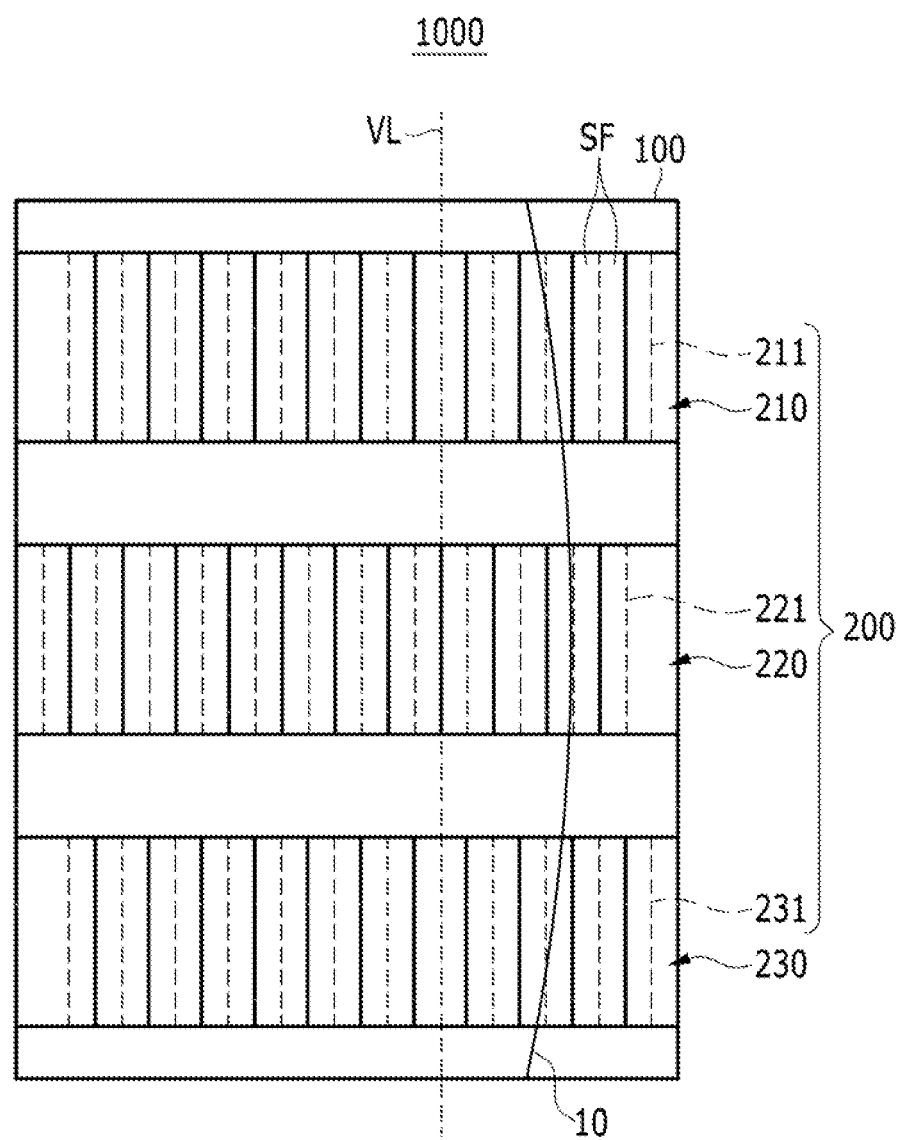
FIG. 3 shows the bottom of the substrate storage apparatus according to the first example embodiment, shown in FIG. 2.

FIG. 3 shows the bottom of the substrate storage apparatus according to the first example embodiment, shown in FIG. 2.

In the present example embodiment shown in FIG. 3, the pad unit 200 supports the bent substrates 10, and includes a first pad 210, a second pad 220 and a third pad 230.

The first pad 210 is located at the bottom of the main body 100 and includes a first groove 211 holding one edge of a bent substrate 10. The first groove 211 has a 'V' shape formed by neighboring slope faces SF (see also FIG. 2). The elongation direction of the first groove 211 corresponds to a virtual straight line VL.

The second pad 220 for the same bent substrate 10 neighbors the first pad 210 and includes a second groove 221 holding the center of the bent substrate 10. The second groove 221 has a 'V' shape formed by neighboring slope faces SF.

The elongation direction of the second groove 221 does not correspond to the elongation direction of the first groove 211 and the virtual straight line VL. As will be apparent to one of ordinary skill in the art from the description and drawings, the elongation direction of the second groove 221 may not correspond to the elongation direction of the first groove 211 and the virtual straight line VL by being offset from the elongation direction of the first groove 211 and the virtual straight line VL.

In the present example embodiment. the third pad 230 neighbors the second pad 220 and is spaced from the first pad 210 having the second pad 220 therebetween. The third pad 230 includes a third groove 231 holding the other edge of the bent substrate 10. The third groove 231 has a 'V' shape formed by neighboring slope faces SF. The elongation direction of the third groove 231 corresponds to the virtual straight line VL. That is, the elongation directions of the third groove 231 of the third pad 230 and the first groove 211 of the first pad 210 correspond to the virtual straight line VL.

The first groove 211 of the first pad 210 and the third groove 231 of the third pad 230 may be disposed to the right of the second groove 221 of the second pad 220 in FIG. 3. The first groove 211 of the first pad 210 and the third groove 231 of the third pad 230 may be disposed to the direction of the bent center of the substrate 10 with respect to the second groove 221 of the second pad 220.

The second groove 221 of the second pad 220 may be disposed to the left of the first groove 211 of the first pad 210 and the third groove 231 of the third pad 230 in FIG. 3. Specifically, the second groove 221 of the second pad 220 may be disposed in a direction in which the second groove 221 is spaced apart from the bent center of the substrate 10 with respect to the first groove 211 of the first pad 210 and the third groove 231 of the third pad 230.

The first pad 210, the second pad 220 and the third pad 230 may be respectively supported by sliding guides. The first pad 210, the second pad 220 and the third pad 230 may respectively slide according to the sliding guides which are extended in a direction perpendicular to the virtual straight line VL along the sliding guides at the bottom of the main body 100.

As described above, the substrate storage apparatus 1000 according to the first example embodiment may easily store a plurality of bent substrates 10 while spacing the substrates 10 from one another by respectively supporting one edge, the center and the other edge of a bent substrate 10 using the first groove 211 of the first pad 210, the second groove 221 of the second pad 220 and the third groove 231 of the third pad 230.

Furthermore, in the substrate storage apparatus 1000 according to the second example embodiment, the first groove 211, the second groove 221 and the third groove 231 apply stress to the bent substrate 10 in a direction in which the bent substrate 10 becomes flat because the first groove 211 and the third groove 231 respectively supporting one edge and the other edge of the bent substrate 10 are disposed on the virtual straight line VL and the second groove 221 supporting the bent center of the substrate 10 is not disposed on the virtual straight line VL, and thus the bent substrate 10 becomes flat to a predetermined degree and is stored in the substrate storage apparatus 1000. Accordingly, the substrate storage apparatus 1000 according to the first example embodiment may store the plurality of bent substrates 10 flat to a predetermined degree.

Thus, the substrate storage apparatus 1000 capable of easily storing the bent substrates 10 may be provided.

A substrate storage apparatus according to a second example embodiment will now be described with reference to FIG. 4.

In the following, only parts distinguished from the first example embodiment are described and parts that are not explained conform to the first example embodiment. Corresponding constituent elements of the first and second example embodiments use the same reference numerals for better comprehension and ease of description.

Figure 4:
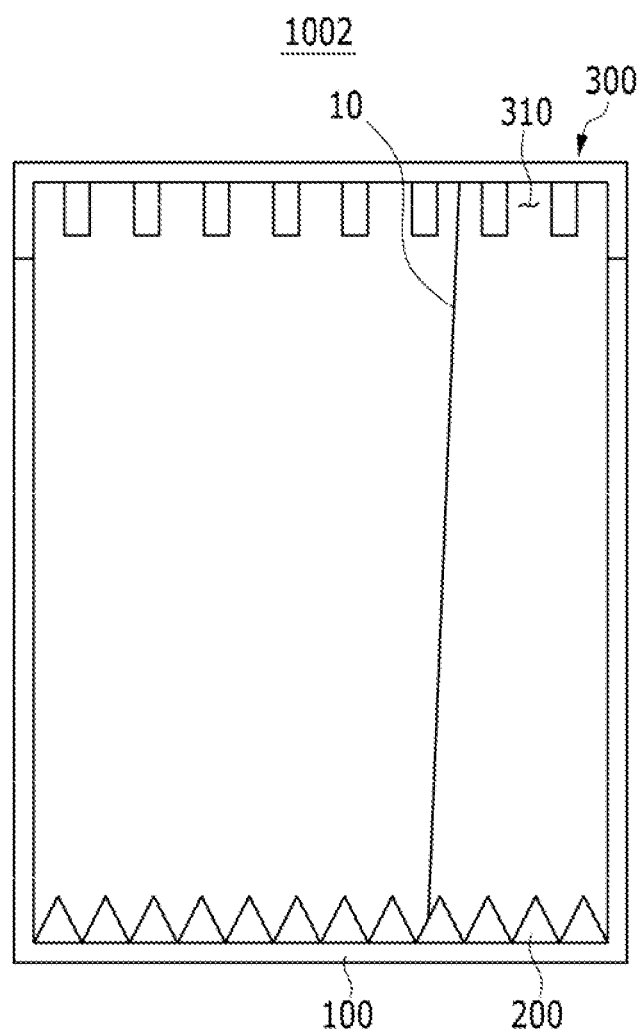
FIG. 4 illustrates a substrate storage apparatus according to a second example embodiment.

FIG. 4 illustrates the substrate storage apparatus according to the second example embodiment.

Referring to FIG. 4, the substrate storage apparatus according to the second example embodiment includes the main body 100, the pad unit 200 and a storage cover 300.

In the present example embodiment, the storage cover 300 covers the main body 100 and includes a supporting groove 310 supporting one edge of a bent substrate 10.

In the present example embodiment, the supporting groove 310 has a rectangular form and supports one edge of the bent substrate 10.

As described above, the substrate storage apparatus 1002 according to the second example embodiment may help prevent the substrate 10 stored therein from being damaged by an external interference because the storage cover 300 protects the substrate 10 by covering the main body 100 in which the substrate 10 is stored.

Furthermore, the substrate storage apparatus 1002 according to the second example embodiment may help prevent one edge of a bent substrate 10 from escaping from the supporting groove 310 of the storage cover 300 since the supporting groove 310 supports one edge of the bent substrate 10 with a rectangular form. Thus, the substrate storage apparatus 1002 according to the second example embodiment may easily store a plurality of substrates 10 by preventing the bent substrates 10 from escaping using the supporting groove 310.

Consequently, the substrate storage apparatus 1002 may be capable of easily storing a plurality of bent substrates 10.

By way of summation and review, technology for forming a pattern on the surface of a substrate and then etching the backside of the substrate has been developed in order to achieve a slim substrate included in a display device. However, since the backside of the substrate is etched, the thickness of the substrate decreases and thus the balance of stress between the pattern and the substrate may be lost, bending the substrate. In this case, when a plurality of bent substrates is stored in the substrate storage apparatus, it may be difficult to store the bent substrates while spacing the substrates from one another.

As described above, embodiments relate to an apparatus for storing a bent substrate. Embodiments may provide an apparatus for storing substrates having advantages of easily storing a plurality of bent substrates.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An apparatus for storing a substrate, the apparatus comprising:
a main body storing the substrate;
a first pad located at a bottom of the main body, the first pad including a plurality of first grooves, the first grooves extending in an elongation direction;
a second pad located at the bottom of the main body, the second pad being spaced apart from and neighboring the first pad, the second pad including a plurality of second grooves, the second grooves extending in an elongation direction parallel to the elongation direction of the first grooves; and
a third pad located at the bottom of the main body, the third pad being spaced from the first pad, the second pad being disposed between the first pad and the third pad, the third pad including a plurality of third grooves, the third grooves extending in an elongation direction parallel to the elongation direction of the first grooves and the second grooves, wherein:
the first pad, the second pad, and the third pad are all on a same plane,
a virtual straight line centered in one of the grooves of the first pad and extending in a direction parallel to the elongation direction of the grooves of the first pad is centered in one of the grooves of the third pad and is not centered in any of the grooves of the second pad.

2. The apparatus of claim 1, wherein each of the first, second and third grooves is formed by neighboring slope faces.

3. The apparatus of claim 1, further comprising a storage cover covering the main body and including a supporting groove for supporting one edge of the substrate.

4. The apparatus of claim 3, wherein the supporting groove has a rectangular form.

* * * * *